United States Patent
Kuo et al.

(10) Patent No.: US 9,704,755 B2
(45) Date of Patent: Jul. 11, 2017

(54) MULTI-GATE DEVICE STRUCTURE INCLUDING A FIN-EMBEDDED ISOLATION REGION AND METHODS THEREOF

(71) Applicant: Taiwan Semiconductor Manufacturing Company, Ltd., Hsin-Chu (TW)

(72) Inventors: Chih-Wei Kuo, Tainan (TW); Hou-Yu Chen, Hsinchu County (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/213,179

(22) Filed: Jul. 18, 2016

(65) Prior Publication Data

US 2016/0329252 A1   Nov. 10, 2016

Related U.S. Application Data

(63) Continuation of application No. 14/464,315, filed on Aug. 20, 2014, now Pat. No. 9,397,157.

(51) Int. Cl.
*H01L 27/088* (2006.01)
*H01L 21/8234* (2006.01)
(Continued)

(52) U.S. Cl.
CPC .... *H01L 21/823481* (2013.01); *H01L 21/762* (2013.01); *H01L 27/0886* (2013.01); *H01L 29/0649* (2013.01); *H01L 29/0653* (2013.01); *H01L 29/0847* (2013.01); *H01L 29/6681* (2013.01); *H01L 29/66545* (2013.01);
(Continued)

(58) Field of Classification Search
None
See application file for complete search history.

(56) References Cited

U.S. PATENT DOCUMENTS 9,006,811 B2   4/2015   Meiser et al.
9,397,157 B2 *  7/2016   Kuo ................... H01L 29/0649
(Continued)

OTHER PUBLICATIONS

Burger, W.R., "Recent advances in RF-LDMOS high-power IC development," IC Design and Technology, 2009. ICICDT '09. IEEE International Conference on , vol., No., pp. 35,38, May 18-20, 2009 doi: 10.1109/ICICDT.2009.5166259.

*Primary Examiner* — Angel Roman
(74) *Attorney, Agent, or Firm* — Haynes and Boone, LLP

(57) ABSTRACT

A structure and method for implementation of high voltage devices within multi-gate device structures includes a substrate having a fin extending therefrom and a fin-embedded isolation region. In some examples, the fin-embedded isolation region includes an STI region. In some embodiments, the fin-embedded isolation separates a first portion of the fin from a second portion of the fin. Also, in some examples, the first portion of the fin includes a channel region. In various embodiments, a source region is formed in the first portion of the fin, a drain region is formed in the second portion of the fin, and an active gate is formed over the channel region. In some examples, the active gate is disposed adjacent to the source region. In addition, a plurality of dummy gates may be formed over the fin, to provide a uniform growth environment and growth profile for source and drain region formation.

20 Claims, 16 Drawing Sheets

(51) Int. Cl.
*H01L 29/06* (2006.01)
*H01L 29/78* (2006.01)
*H01L 21/762* (2006.01)
*H01L 29/66* (2006.01)
*H01L 29/08* (2006.01)
*H01L 29/40* (2006.01)
*H01L 29/51* (2006.01)

(52) U.S. Cl.
CPC ...... *H01L 29/7835* (2013.01); *H01L 29/7851* (2013.01); *H01L 29/402* (2013.01); *H01L 29/517* (2013.01)

(56) References Cited

U.S. PATENT DOCUMENTS

| | | |
|---|---|---|
| 2014/0008733 A1* | 1/2014 | Shrivastava .... H01L 21/823807 257/401 |
| 2015/0255462 A1 | 9/2015 | Liaw |
| 2016/0056232 A1 | 2/2016 | Kuo et al. |

* cited by examiner

MULTI-GATE DEVICE STRUCTURE INCLUDING A FIN-EMBEDDED ISOLATION REGION AND METHODS THEREOF

PRIORITY DATA

The present application is a continuation patent application of U.S. patent application Ser. No. 14/464,315 filed on Aug. 20, 2014, which will issue as U.S. Pat. No. 9,397,157, the disclosure of which is hereby incorporated by reference in its entirety.

BACKGROUND

The electronics industry has experienced an ever increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). Thus far these goals have been achieved in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in semiconductor ICs and devices calls for similar advances in semiconductor manufacturing processes and technology.

Recently, multi-gate devices have been introduced in an effort to improve gate control by increasing gate-channel coupling, reduce OFF-state current, and reduce short-channel effects (SCEs). One such multi-gate device that has been introduced is the fin field-effect transistor (FinFET). The FinFET gets its name from the fin-like structure which extends from a substrate on which it is formed, and which is used to form the FET channel. FinFETs are compatible with conventional complementary metal-oxide-semiconductor (CMOS) processes and their three-dimensional structure allows them to be aggressively scaled while maintaining gate control and mitigating SCEs. In addition, high voltage devices are being widely used in CMOS-based technologies. For example, laterally diffused metal-oxide-semiconductor (LDMOS) devices, fabricated using conventional CMOS processing, have become an attractive power device for use in radio frequency (RF) power applications (e.g., cellular infrastructure power amplifier applications). However, the complexities of multi-gate device architectures, and their related fabrication processes, have presented new challenges for the implementation of high voltage devices. In short, existing semiconductor fabrication techniques have not proved entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3A illustrates a perspective view of a high voltage device after formation of a plurality of fins and isolation regions, according to some embodiments;

DETAILED DESCRIPTION

Figure 1:
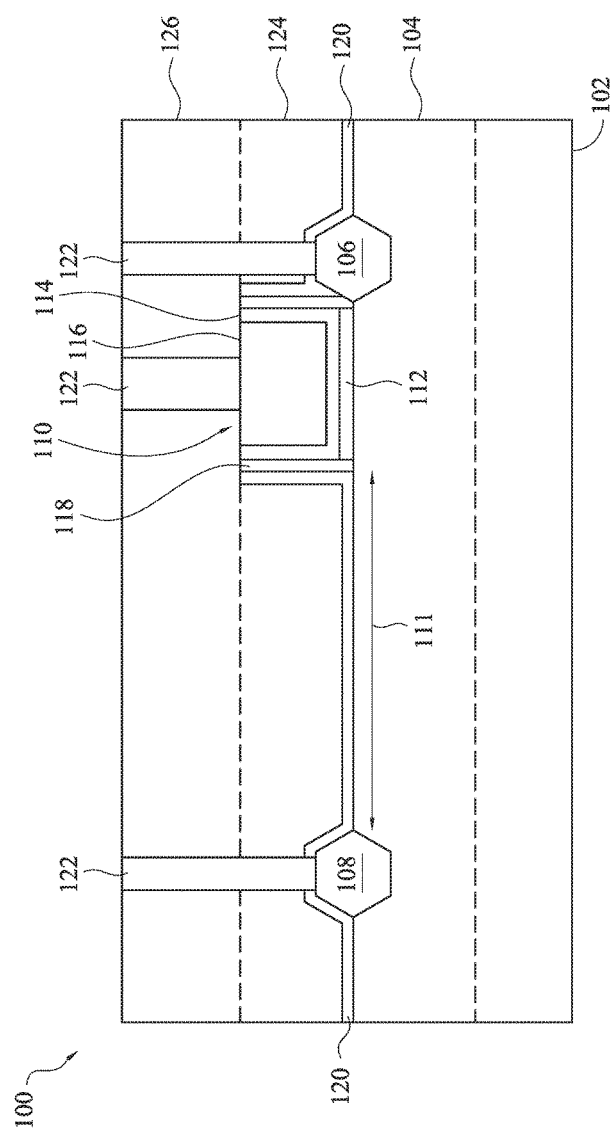
FIG. 1 is cross-sectional view of an embodiment of a high voltage device according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is also noted that the present disclosure presents embodiments in the form of multi-gate transistors or fin-type multi-gate transistors referred to herein as FinFET devices. Such a device may include a P-type metal-oxide-semiconductor FinFET device or an N-type metal-oxide-semiconductor FinFET device. The FinFET device may be a dual-gate device, tri-gate device, bulk device, silicon-on-insulator (SOI) device, and/or other configuration. One of ordinary skill may recognize other embodiments of semiconductor devices that may benefit from aspects of the present disclosure. For example, some embodiments as described herein may also be applied to gate-all-around (GAA) devices, Omega-gate (Ω-gate) devices, or Pi-gate (Π-gate) devices.

Illustrated in FIG. 1 is a high voltage (HV) device 100. The HV device 100 shows an example of a conventional, planar laterally diffused metal-oxide-semiconductor (LDMOS) device, which is herein briefly described for the purpose of providing context and clarity to the discussion that follows. As described above, such HV devices are of interest, for example, as power devices for use in radio frequency (RF) power applications (e.g., cellular infrastructure power amplifier applications). The HV device 100 is fabricated on a substrate 102 (e.g., a silicon substrate) using conventional CMOS processing techniques. In some examples, an epitaxial (epi) layer 104 is formed over the substrate 102 using an epitaxial growth process such as molecular beam epitaxy (MBE), metalorganic chemical vapor deposition (MOCVD), or other suitable growth process. The epi layer 104 may further include one or more doped regions, for example such as highly-doped source and drain regions, high-voltage doped regions, and/or a doped sinker region. The one or more doped regions may be formed, for example, by thermal diffusion, ion implantation, or other suitable technique. For purposes of illustration, the HV device 100 includes a source 106, a drain 108, a gate stack 110, and spacers 118 formed on either side of the gate stack 110. By way of example, the gate stack 110 may include an interfacial oxide layer 112, a high-K dielectric layer 114, and a metal layer 116. In some examples, a contact etch stop layer (CESL) 120 and a first inter-layer dielectric (e.g., ILD0) layer 124 are formed over the HV device 100 after formation of the source 106 and the drain 108. A second inter-layer dielectric (e.g., ILD1) layer 126 is formed over the HV device 100, and contact openings can be formed within the dielectric layers 124, 126, followed by contact metal deposition for the formation of source, drain, and gate contacts 122.

A particular feature of the HV device 100 is a large drain extension region 111. By way of example, the drain extension region 111 may include a low doping concentration drift region between a device channel (e.g., under the gate stack 110) and the drain 108. Such a low doping concentration drift region is configured to provide a high device breakdown voltage and protection from hot-carrier injection (HCI). While LDMOS devices have been widely implemented in standard CMOS-based processes, a suitable LDMOS process has yet to be implemented within multi-gate device architectures. At least one of the challenges to the implementation of planar, high-voltage devices within advanced multi-gate structures is the vastly different device environments (i.e., device structures or architectures), which can lead to undesirable loading effects during processing. For example, large drain extension regions such as the drain extension region 111 can present significant process challenges in an advanced, scaled multi-gate device processing environment (e.g., a FinFET processing environment). The larger drive current available in multi-gate devices, as well as enhanced gate-channel coupling, and the electric field profiles present in thin, multi-gate devices (e.g., FinFET devices), can also present a challenge in high-voltage devices, and in some examples may cause premature device breakdown or other reliability degradation effects (e.g., HCI). Additionally, non-uniform epitaxial layer growth (e.g., of the source 106 and the drain 108) can lead to non-uniformities and/or degradation in device performance or device reliability.

Embodiments of the present disclosure offer advantages over the existing art, though it is understood that other embodiments may offer different advantages, not all advantages are necessarily discussed herein, and no particular advantage is required for all embodiments. For example, embodiments discussed herein include structures and methods for implementation of high-voltage devices (e.g., LDMOS devices) within multi-gate device structures (e.g., FinFET device structures). In some embodiments, a shallow trench isolation (STI) feature is formed between a FinFET channel (e.g., under a FinFET gate stack) and drain, in order to increase a drain extension resistance and also ensure that any high-voltage region remains far from the active device gate. In some embodiments, one or more dummy gates are formed, in addition to the active gate, in order to provide a uniform epitaxial growth profile for both source and drain regions. As used herein, the term "growth profile" may include both a doping profile as well as a physical profile (i.e., a shape of the grown source/drain epi regions). As used herein, a "dummy" structure, such as a dummy gate or dummy gate stack, is to be understood as referring to a structure which is utilized to mimic a physical property of another structure (e.g., such as to mimic the physical dimensions of a channel, a gate, and/or other structure), and which is circuit inoperable (i.e., which is not part of a circuit current flow path) in the final fabricated device. For example, a "dummy gate", as described herein, is understood to mean an electrically non-functional gate. In some examples, use of dummy gates provide for uniform epitaxial growth profiles regardless of any specific device layout. Those skilled in the art will recognize other benefits and advantages of the methods and devices as described herein, and the embodiments described are not meant to be limiting beyond what is specifically recited in the claims that follow.

Figure 2:
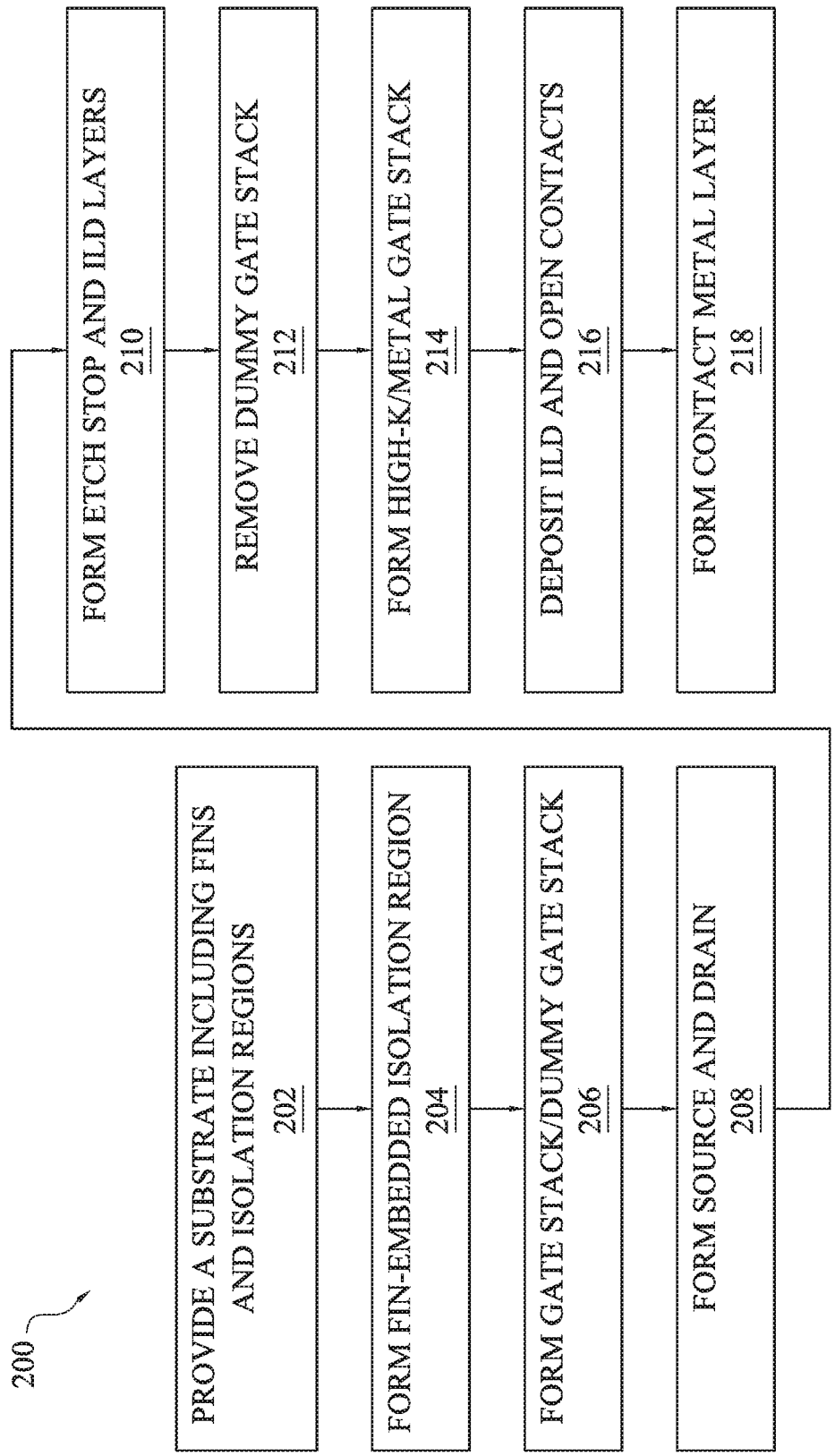
FIG. 2 is a flow chart of a method of fabricating a high voltage device according to one or more aspects of the present disclosure.

Referring now to FIG. 2, illustrated is a method 200 of fabricating a high-voltage device including an LDMOS device within a fin structure. In some embodiments, the method 200 may be used to fabricate a semiconductor device 300 (e.g., including an HV device), described below with reference to FIGS. 3A/3B, 4A/4B, and 5-14. To be sure, one or more aspects discussed above with reference to the HV device 100 may also apply to the method 200 and to the semiconductor device 300. Additionally, FIGS. 3A/3B, 4A/4B, and 5-14 provide perspective and/or cross-sectional views of the exemplary semiconductor device 300 fabricated according to one or more steps of the method 200 of FIG. 2.

It is understood that parts of the method 200 and/or the semiconductor device 300 may be fabricated by a well-known complementary metal-oxide-semiconductor (CMOS) technology process flow, and thus some processes are only briefly described herein. Further, the semiconductor device 300 may include various other devices and features, such as additional transistors, bipolar junction transistors, resistors, capacitors, diodes, fuses, etc., but is simplified for a better understanding of the inventive concepts of the present disclosure. Further, in some embodiments, the semiconductor device 300 includes a plurality of semiconductor devices (e.g., transistors), which may be interconnected.

The device 300 may be an intermediate device fabricated during processing of an integrated circuit, or portion thereof, that may comprise static random access memory (SRAM) and/or other logic circuits, passive components such as resistors, capacitors, and inductors, and active components such as P-channel field-effect transistors (PFETs), N-channel FETs (NFETs), metal-oxide-semiconductor field-effect transistors (MOSFETs), complementary metal-oxide-semiconductor (CMOS) transistors, bipolar transistors, high voltage transistors, high frequency transistors, other memory cells, and/or combinations thereof.

Figure 3A:
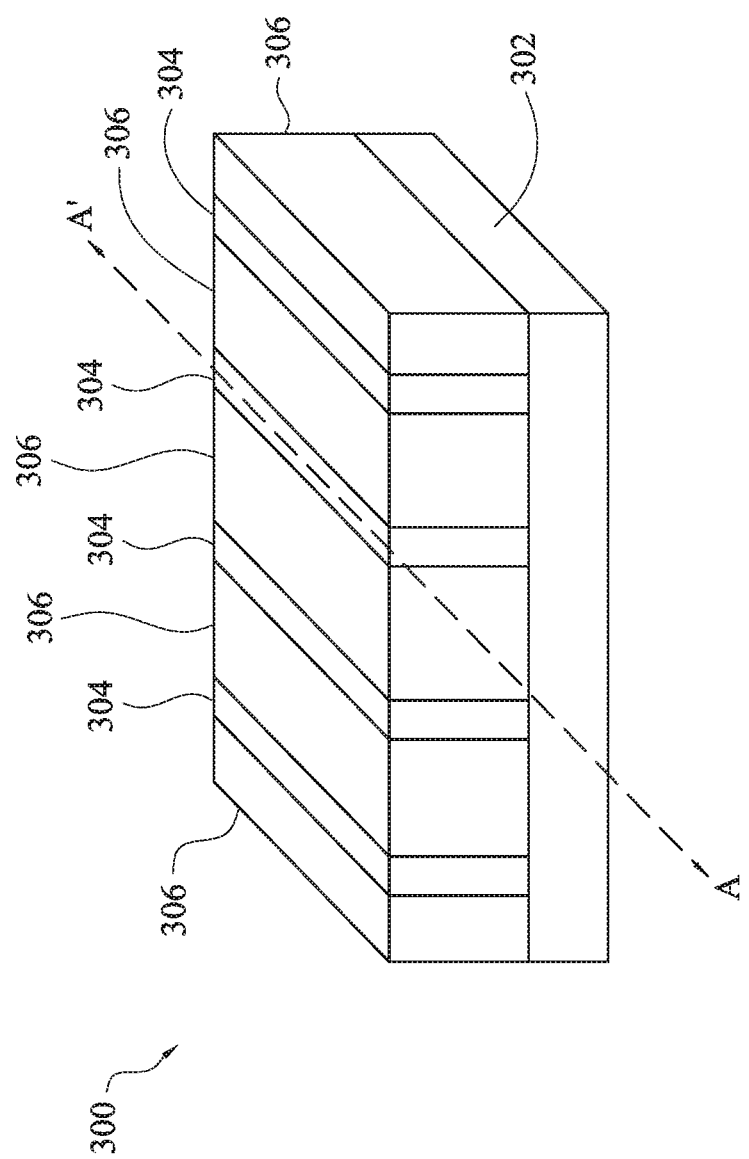
FIGS. 3A/3B, 4A/4B, and 5-12 illustrate perspective and cross sectional views of an embodiment of a high voltage device corresponding to one or more steps of the method of FIG. 2.
Figure 3B:
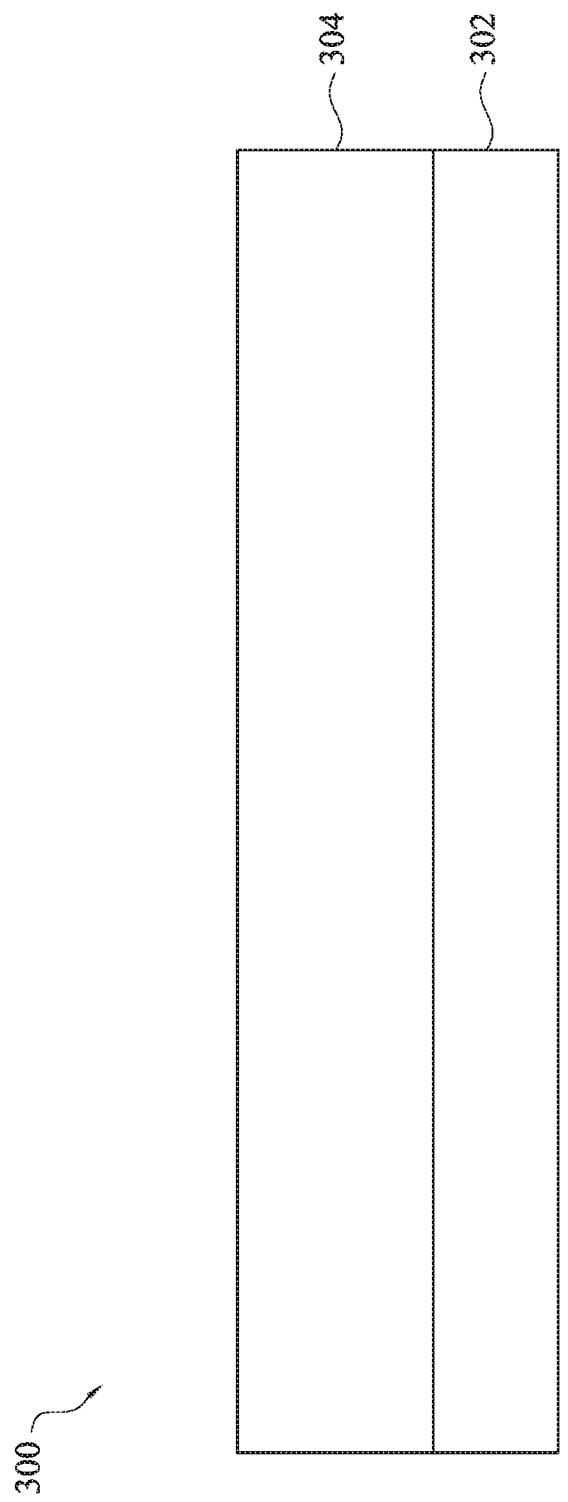
FIG. 3B illustrates a cross-sectional view of the high voltage device of FIG. 3A, provided along a cross-sectional view substantially similar to section AA', according to some embodiments.

Referring now to the method 200, the method 200 begins at block 202 where a substrate including fins and isolation regions is provided. Referring to the example of FIG. 3A, illustrated is a semiconductor device 300 including a semiconductor substrate 302, a plurality of fin elements 304 extending from the substrate 302, and isolation regions 306. FIG. 3B provides a cross-sectional view along an individual fin, substantially similar to section AA' of FIG. 3A. The substrate 302 may be a semiconductor substrate such as a silicon substrate. In some embodiments, the substrate 302 may include various layers, including conductive or insulating layers formed on a semiconductor substrate. In some examples, the substrate 302 may include various doping configurations depending on design requirements as is known in the art. In some embodiments, the substrate 302 may also include other semiconductors such as germanium, silicon carbide (SiC), silicon germanium (SiGe), or diamond. Alternatively, in some embodiments, the substrate 302 may include a compound semiconductor and/or an alloy semiconductor. Further, in some embodiments, the substrate 302 may include an epitaxial layer (epi-layer), the substrate 302 may be strained for performance enhancement, the substrate 302 may include a silicon-on-insulator (SOI) structure, and/or the substrate 302 may have other suitable enhancement features.

The fin elements 304, like the substrate 302, may comprise silicon or another elementary semiconductor, such as germanium; a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, InGaAs, GaInP, and/or GaInAsP; or combinations thereof. The fin elements 304 may be fabricated using suitable processes including photolithography and etch processes. The photolithography process may include forming a photoresist layer (resist) overlying the substrate (e.g., on a silicon layer), exposing the resist to a pattern, performing post-exposure bake processes, and developing the resist to form a masking element including the resist. In some embodiments, patterning the resist to form the masking element may be performed using an electron beam (e-beam) lithography process. The masking element may then be used to protect regions of the substrate 302 while an etch process forms recesses into the silicon layer, thereby leaving the extending fin elements 304. The recesses may be etched using a dry etch (e.g., chemical oxide removal), a wet etch, and/or other suitable processes. Numerous other embodiments of methods to form the fin elements 304 on the substrate 302 may also be used.

The isolation regions 306 may include shallow trench isolation (STI) features. Alternatively, a field oxide, a LOCOS feature, and/or other suitable isolation features may be implemented on and/or within the substrate 302. The isolation regions 306 may be composed of silicon oxide, silicon nitride, silicon oxynitride, fluorine-doped silicate glass (FSG), a low-k dielectric, combinations thereof, and/or other suitable material known in the art. In an embodiment, the isolation regions 306 are STI features and are formed by etching trenches in the substrate 302. The trenches may then be filled with isolating material, followed by a chemical mechanical polishing (CMP) process to planarize a top surface of the device 300. However, other embodiments are possible. In some embodiments, the isolation regions 306 may include a multi-layer structure, for example, having one or more liner layers.

In some embodiments, prior to the formation of the fin elements 304, a first dielectric layer may be formed over the substrate 302, and a second dielectric layer may be formed over the first dielectric layer. By way of example, the first dielectric layer may include a pad oxide layer (e.g., $SiO_2$) which may be used as a buffer layer between adjacent layers. In some embodiments, the first dielectric layer includes thermally grown oxide, CVD-deposited oxide, and/or ALD-deposited oxide. In some embodiments, the second dielectric layer includes a pad nitride layer (e.g., $Si_3N_4$), and the second dielectric layer may be deposited by CVD or other suitable technique.

In some embodiments, after formation of the fin elements 304 and formation of the isolation regions 306, a well implant may be performed, for example using an ion implantation process and employing a suitable N-type or P-type dopant. Thus, the well implant may be used to form an N- or P-well within the fin elements 304. In some embodiments the N-type dopant includes arsenic, phosphorous, antimony, or other N-type donor material. In some embodiments, the P-type dopant includes boron, aluminum, gallium, indium, or other P-type acceptor material. In some embodiments, such N- or P-type dopants may be used to form highly-doped source/drain regions; high-voltage doped regions, which may be referred to as N-channel drift regions (NHV) or P-channel drift (PHV) regions; doped sinker regions; a reduced surface field (RESURF) layer; and/or or other doped extension and/or well regions. In some embodiments, similar N-type or P-type dopants may be used to perform anti-punch through (APT) ion implantation through the fin elements 304, for example, to reduce sub-threshold source-to-drain leakage as well as drain-induced barrier lowering (DIBL). In some embodiments, other ion implant processes may also be performed, such as a threshold voltage ($V_t$) adjust implant, a halo implant, or other suitable implant. After an ion implantation process, the semiconductor device 300 may be subjected to a high temperature anneal, for example greater than approximately 800° C., in order to remove defects and activate dopants (i.e., to place dopants into substitutional sites). In some examples, the doped regions described above may be formed by one or more of an ion implant process, by thermal diffusion, by doped epitaxial growth, or by another suitable technique. Thus, block 202 of the method 200 provides a substrate having a plurality of fins and interposing dielectric isolation features.

Figure 4A:
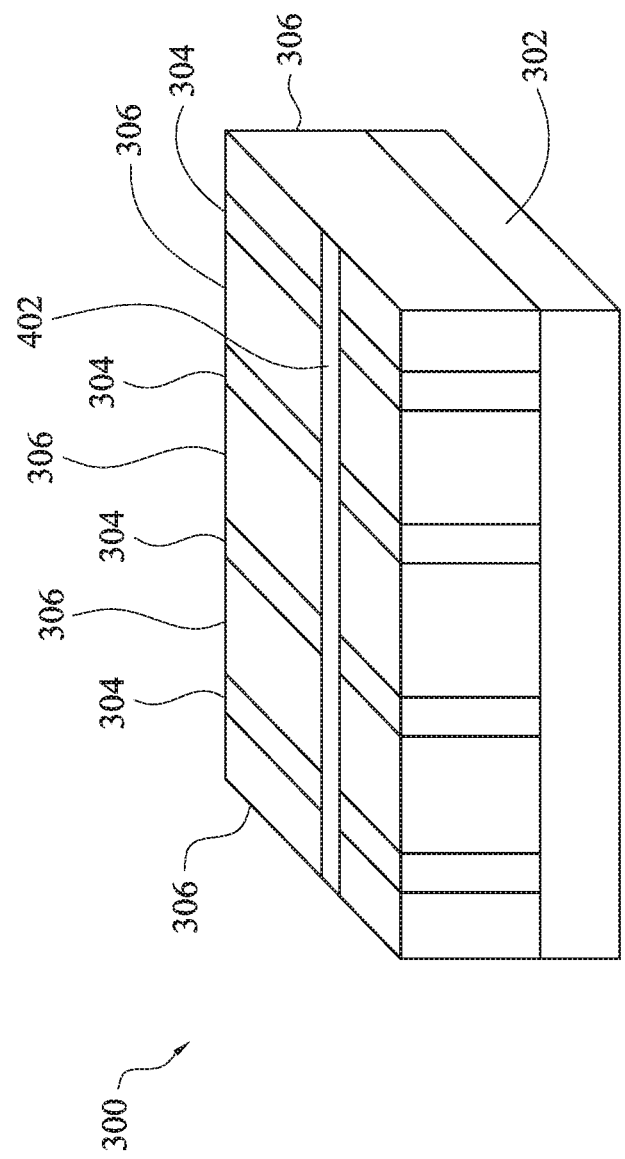
FIG. 4A illustrates a perspective view of a high voltage device after formation of a fin-embedded isolation region, according to some embodiments.
Figure 4B:
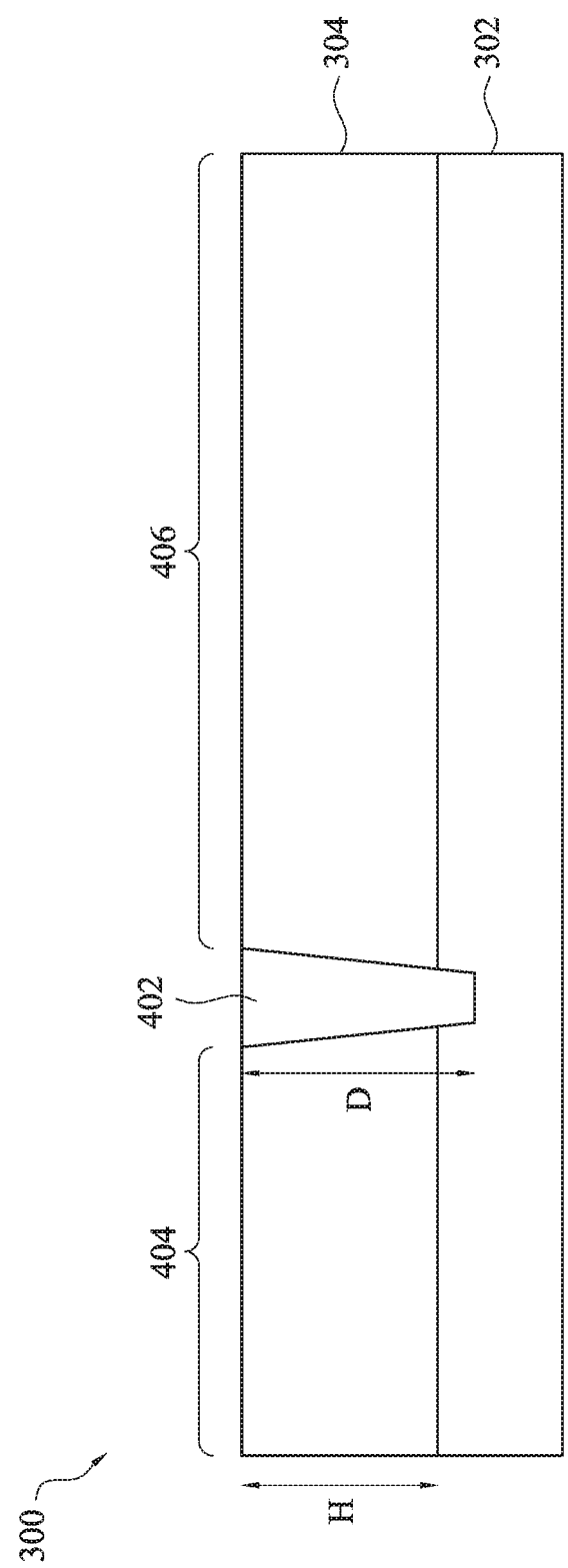
FIG. 4B illustrates a cross-sectional view of the high voltage device of FIG. 4A, provided along a cross-sectional view substantially similar to section AA', according to some embodiments.

The method 200 then proceeds to block 204 where a fin-embedded isolation region is formed. Referring to the example of FIG. 4A, illustrated is the semiconductor device 300 including a fin-embedded isolation region 402. In some embodiments, the fin-embedded isolation region 402 includes an STI isolation region. Alternatively, in some embodiments, the fin-embedded isolation region 402 may be implemented using a field oxide, a LOCOS feature, and/or other suitable isolation feature. As shown, the fin-embedded isolation region 402 is oriented substantially perpendicular to the plurality of fin elements 304. FIG. 4B provides a cross-sectional view along an individual fin, and including the fin-embedded isolation region 402, substantially similar to section AA' of FIG. 4A. In some embodiments, the fin-embedded isolation region 402 is formed by patterning (e.g., by a photolithography process) and etching (e.g., using a wet or dry etch) processes to form a trench substantially perpendicular to the plurality of fin elements 304. Thereafter, the trench may be filled, for example, using a dielectric material similar to a material used for the isolation regions 306 and including silicon oxide, silicon nitride, silicon oxynitride, fluorine-doped silicate glass (FSG), a low-k dielectric, combinations thereof, and/or other suitable material known in the art. A CMP process may then be performed to planarize a top surface of the device 300. Those skilled in the art will recognize that other embodiments are possible without departing from the scope of the present disclosure. For example, in some embodiments, the fin-embedded isolation region 402 may include a multi-layer structure, for example, having one or more liner layers.

As illustrated in FIG. 4B, the fin-embedded isolation region 402 extends into the substrate 302, to a penetration depth 'D'. In an embodiment, the penetration depth 'D' is provided to a depth that effectively isolates/separates a first side 404 of the fin element 304 from a second side 406 of the fin element 304. Moreover, considering that an N- or P-well, and/or other doped regions, are formed within the fin elements 304, as described above, the fin-embedded isolation region 402 may also effectively isolate such N-/P-well, and/or other doped regions, within the first side 404 of the fin element 304 from those regions within the second side 406 of the fin element 304. In some embodiments, the penetration depth 'D' of the fin-embedded isolation region 402 is greater than a height 'H' of the fin element 304, and thus extends into the substrate 302, as described above. In some embodiments, the penetration depth 'D' of the fin-embedded isolation region 402 is substantially equal to the height 'H' of the fin element 304. In some examples, the penetration depth 'D' of the fin-embedded isolation region 402 is less than the height 'H' of the fin element 304. As discussed above, as well as in more detail below with reference to FIGS. 7, 13, and 14, the fin-embedded isolation region 402 is disposed between a FinFET channel (e.g., under a FinFET gate stack) and drain, in order to increase a drain extension resistance and also ensure that any high-voltage region remains far from the active device gate.

In some embodiments, the isolation regions 306 around the fin elements 304 are recessed to laterally expose an upper portion of the fins elements 304. In some embodiments, the same dielectric material may be used for each of the isolation regions 306 and the fin-embedded isolation region 402. Thus, in some embodiments, recessing of the isolation regions 306 may also etch the fin-embedded isolation region 402. Such a recessing process may include a dry etching process, a wet etching process, and/or a combination thereof. For example, in some embodiments, the recessing process may include a dry, plasma-free process using a reaction gas or reaction gas combination, such as $HF+NH_3$, or plasma process, or a reaction gas combination, such as $NF_3+NH_3$, and/or other suitable reaction gases. In some embodiments, the dry, plasma-free recessing process is performed using a CERTAS® Gas Chemical Etch System, available from Tokyo Electron Limited, Tokyo, Japan. In some examples, the dry, plasma recessing process is performed using a SICONI® System, available from Applied Materials, Inc., Santa Clara, Calif. In other examples, the recessing process may include a wet etch performed using a dilute mixture of HF (e.g., 49% HF in $H_2O$ by weight) and de-ionized (DI) $H_2O$, where the $HF:H_2O$ ratio is approximately 1:50 or approximately 1:100. In some embodiments, a recessing depth is controlled (e.g., by controlling an etching time) so as to result in a desired height 'H' of an exposed upper portion of the fin elements 304.

Referring now to FIG. 2, the method 200 proceeds to block 206 where a gate stack and sidewall spacers disposed on sidewalls of the gate stack are formed. In some embodiments, the gate stack is a dummy gate stack. In some examples of the method 200, the gate stack may be a metal gate structure. Referring to the example of FIG. 5, an active gate 502 and sidewall spacers 504 are formed on the device 300. Additionally, in some embodiments, one or more dummy gates 506 and including sidewall spacers 508 are also formed on the device 300. As described above, and discussed in more detail with reference to FIG. 14 below, the one or more dummy gates 506 provide for a uniform epitaxial growth profile for both source and drain regions. Formation of the dummy gates 506 may be omitted from the method 200, and for clarity of discussion, the dummy gates 506 are not illustrated in FIGS. 6-13.

While embodiments are described herein by way of an exemplary gate-last process, it will be understood that embodiments of the present disclosure are not limited to such a process. In some embodiments, various aspects of the present disclosure may be applicable to a gate-first process. In some examples, a gate-first process includes formation of a gate stack prior to source/drain formation or source/drain dopant activation. Merely by way of example, a gate-first process may include gate dielectric and polysilicon or metal gate depositions, followed by a gate stack etch process to define a gate critical dimension (CD). In some embodiments of a gate-first process, gate stack formation may be followed by source/drain formation including doping of source/drain regions and, in some examples, annealing for source/drain dopant activation.

In one embodiment using a gate-last process, the active gate 502 includes a dummy gate stack that will be replaced by a final gate stack at a subsequent processing stage of the semiconductor device 300. In particular, the dummy gate stack of the active gate 502 may be replaced at a later processing stage by a high-K dielectric layer (HK) and metal gate electrode (MG). Similarly, in embodiments which include the dummy gates 506, the dummy gates 506 may include a dummy gate stack that may be replaced at a later processing stage by a high-K dielectric layer and metal gate electrode. In the illustrated embodiment, the active gate 502 is formed over the substrate 302 and is at least partially disposed over the fin elements 304. In one embodiment, the active gate 502 includes a dielectric layer 510 and an electrode layer 512. Similarly, in embodiments employing the dummy gates 506, each of the dummy gates 506 may include a dielectric layer 514 and an electrode layer 516. Moreover, in some embodiments, a material used for the dielectric layer 510 may be the same as a material used for the dielectric layer 514. Also, in some embodiments, a material used for the electrode layer 512 may be the same as a material used for the electrode layer 516. In some embodiments, the active gate 502 and the dummy gates 506 are formed by various process steps such as layer deposition, patterning, etching, as well as other suitable processing steps. In some examples, the layer deposition process includes CVD (including both low-pressure CVD and plasma-enhanced CVD), PVD, ALD, thermal oxidation, e-beam evaporation, or other suitable deposition techniques, or a combination thereof. In some embodiments, the patterning process includes a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etching process may include dry etching (e.g., RIE or ICP etching), wet etching, and/or other etching methods. In some examples which include the dummy gates 506, the dielectric layers 510, 514 of each of the active and dummy gates 502, 506 may be formed simultaneously, the electrode layers 512, 516, of each of the active and dummy gates 502, 506 may be formed simultaneously, and the sidewall spacers 504, 508 of each of the active and dummy gates 502, 506 may be formed simultaneously.

In some embodiments, the dielectric layers 510, 514 of the active gate 502 and the dummy gates 506 include silicon oxide. Alternatively or additionally, the dielectric layers 510, 514 may include silicon nitride, a high-K dielectric material or other suitable material. In some embodiments, the electrode layers 512, 516 of the active gate 502 and the dummy gates 506 may include polycrystalline silicon (polysilicon). In some embodiments, a hard mask (e.g., including a dielectric material such as silicon nitride, silicon oxynitride or silicon carbide) may also be formed over the active gate 502 or the dummy gates 506.

Figure 5:
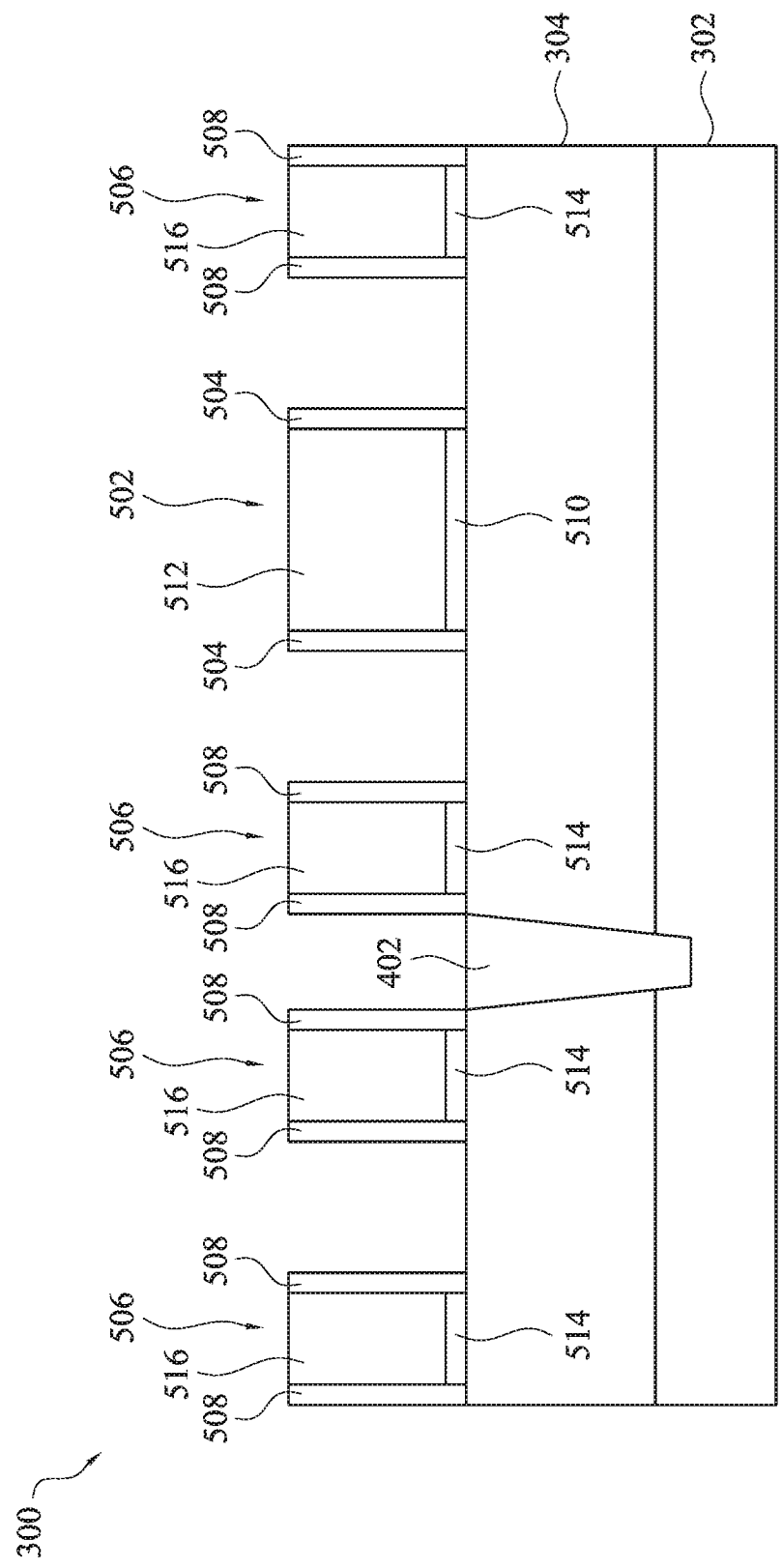
FIG. 5 illustrates a cross-sectional view of the high voltage device after formation of a gate stack, according to some embodiments.
Figure 6:
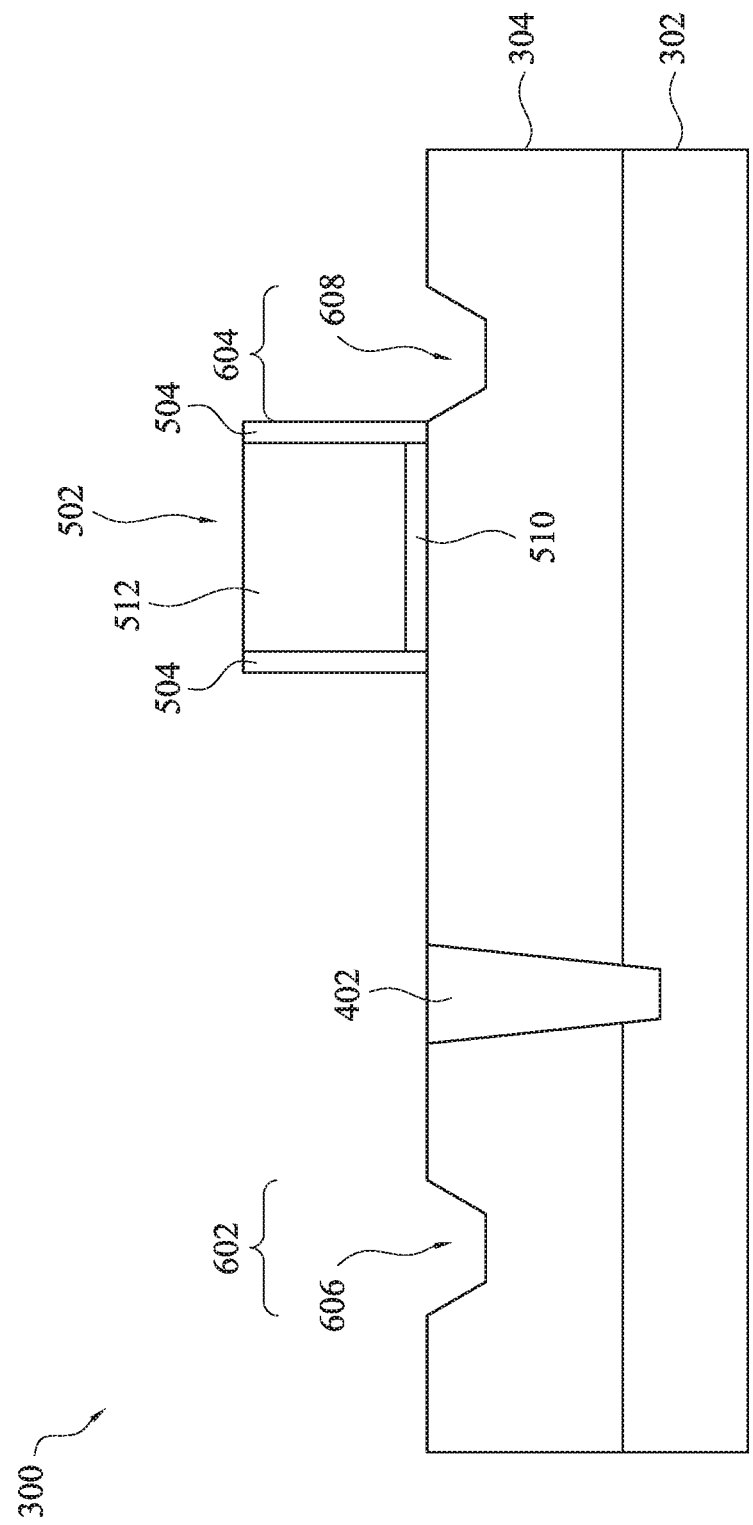
FIG. 6 illustrates a cross-sectional view of the high voltage device after formation of a drain recess and a source recess, according to some embodiments.

Still referring to FIG. 5, the sidewall spacers 504, 508 may include a dielectric material such as silicon oxide, silicon nitride, silicon carbide, silicon oxynitride, or combinations thereof. In some embodiments, the sidewall spacers 504, 508 include multiple layers, such as main spacer walls, liner layers, and the like. By way of example, the sidewall spacers 504, 508 may be formed by depositing a dielectric material over the active gate 502 and/or the dummy gates 506 and anisotropically etching back the dielectric material. In some embodiments, the etch-back process (e.g., for spacer formation) may include a multiple-step etching process to improve etch selectivity and provide over-etch control. In some embodiments, prior to forming the sidewall spacers 504, 508, an ion implantation process may be performed to form lightly-doped drain (LDD) features within the semiconductor device 300. In some examples, such LDD features may be formed by in-situ doping prior to forming the sidewall spacers 504, 508. In yet other examples, an ion implantation process may be performed after forming the sidewall spacers 504, 508 to form the LDD features. In some embodiments, before or after formation of the sidewall spacers 504, 508, in-situ doping and/or ion implantation may be used to form highly-doped source/drain regions, N-channel drift (NHV) or P-channel drift (PHV) regions, doped sinker regions, a reduced surface field (RESURF) layer, and/or or other doped extension and/or well regions. In some embodiments, after one or more implantation processes, the semiconductor device 300 may be subject to a high thermal budget process (anneal) to remove defects and activate dopants (i.e., to place dopants into substitutional sites).

Referring again to the method 200, the method 200 proceeds to block 208 where source/drain features are formed in source/drain regions. Referring to the example of FIG. 6, a drain recess 606 and a source recess 608 may be initially formed in a drain region 602 and a source region 604, respectively. In some embodiments, the drain and source recesses may be formed using standard patterning (e.g., by a photolithography process) and etching (e.g., using a wet or dry etch) processes. In some examples, and with reference to the example of FIG. 7, a drain feature 702 and a source feature 704 are formed in the drain and source recesses 606, 608 of each of the drain and source regions 602, 604, respectively. Alternatively, in some examples, the drain and source features 702, 704 may be formed in the drain and source regions 602, 604, respectively, without prior formation of the drain and source recesses 606, 608. By way of example, the drain and source features 702, 704 may be formed in, on, and/or surrounding the fin element 304. The drain and source features 702, 704 may be formed by epitaxially growing one or more semiconductor material layers in the drain and source regions 602, 604. In various embodiments, the semiconductor material layer grown in the drain and source regions 602, 604 may include Ge, Si, GaAs, AlGaAs, SiGe, GaAsP, SiP, or other suitable material. In some embodiments, the drain and source features 702, 704 may be in-situ doped during the epitaxial growth process. For example, in some embodiments, epitaxially grown SiGe drain and source features 702, 704 may be doped with boron. In other examples, epitaxially grown Si epi drain and source features 702, 704 may be doped with carbon to form Si:C source/drain features, phosphorous to form Si:P source/drain features, or both carbon and phosphorous to form SiCP source/drain features. In some embodiments, the drain and source features 702, 704 are not in-situ doped, and instead an implantation process is performed to dope the drain and source features 702, 704. In some embodiments, a doping dose used to dope the drain and source features 702, 704 is greater than a doping dose used to dope the LDD features, NHV regions, PHV regions, the RESURF layer, or other doped extension regions.

Figure 7:
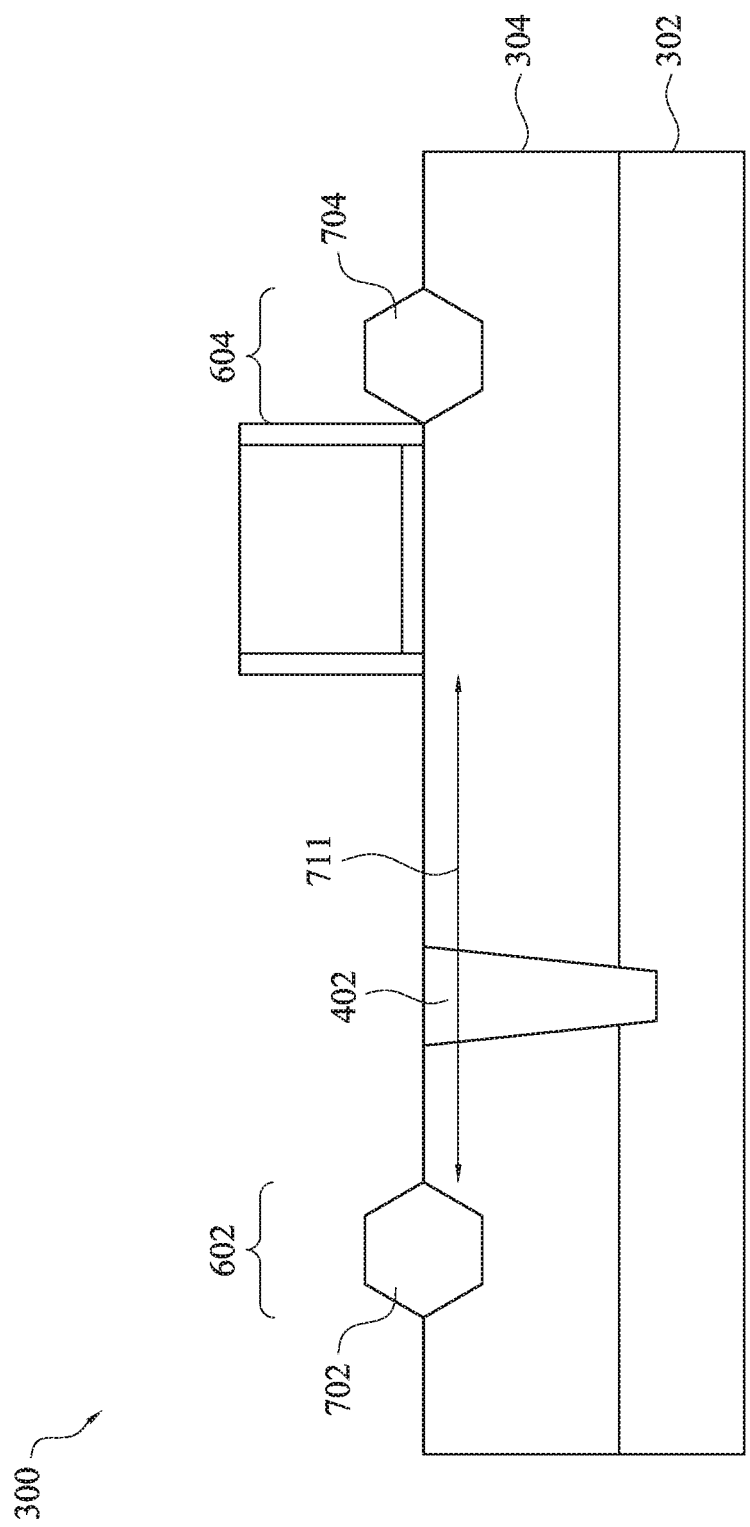
FIG. 7 illustrates a cross-sectional view of the high voltage device after formation of a drain feature and a source feature, according to some embodiments.
Figure 8:
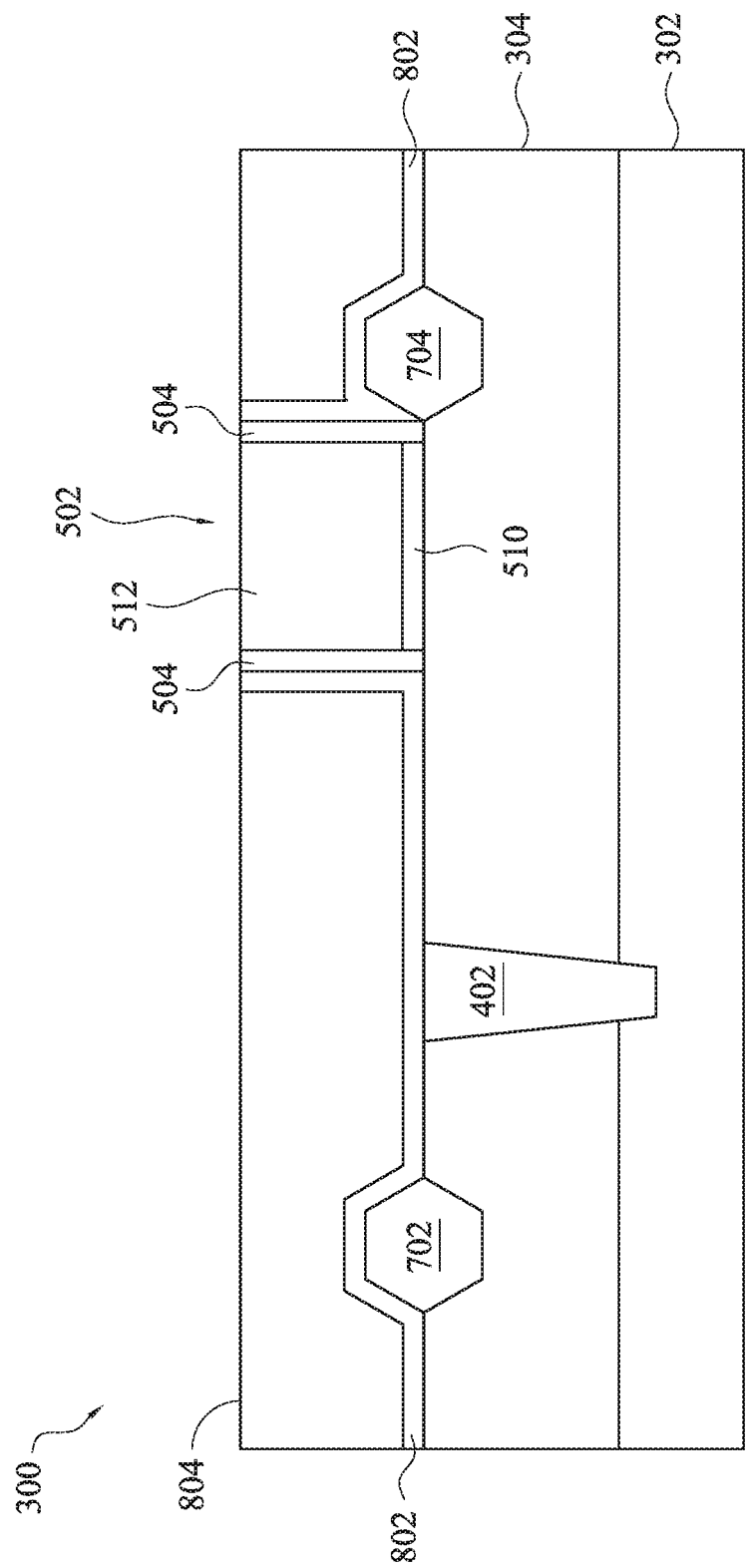
FIG. 8 illustrates a cross-sectional view of the high voltage device after formation of a contact etch stop layer and a dielectric layer, according to some embodiments.
Figure 9:
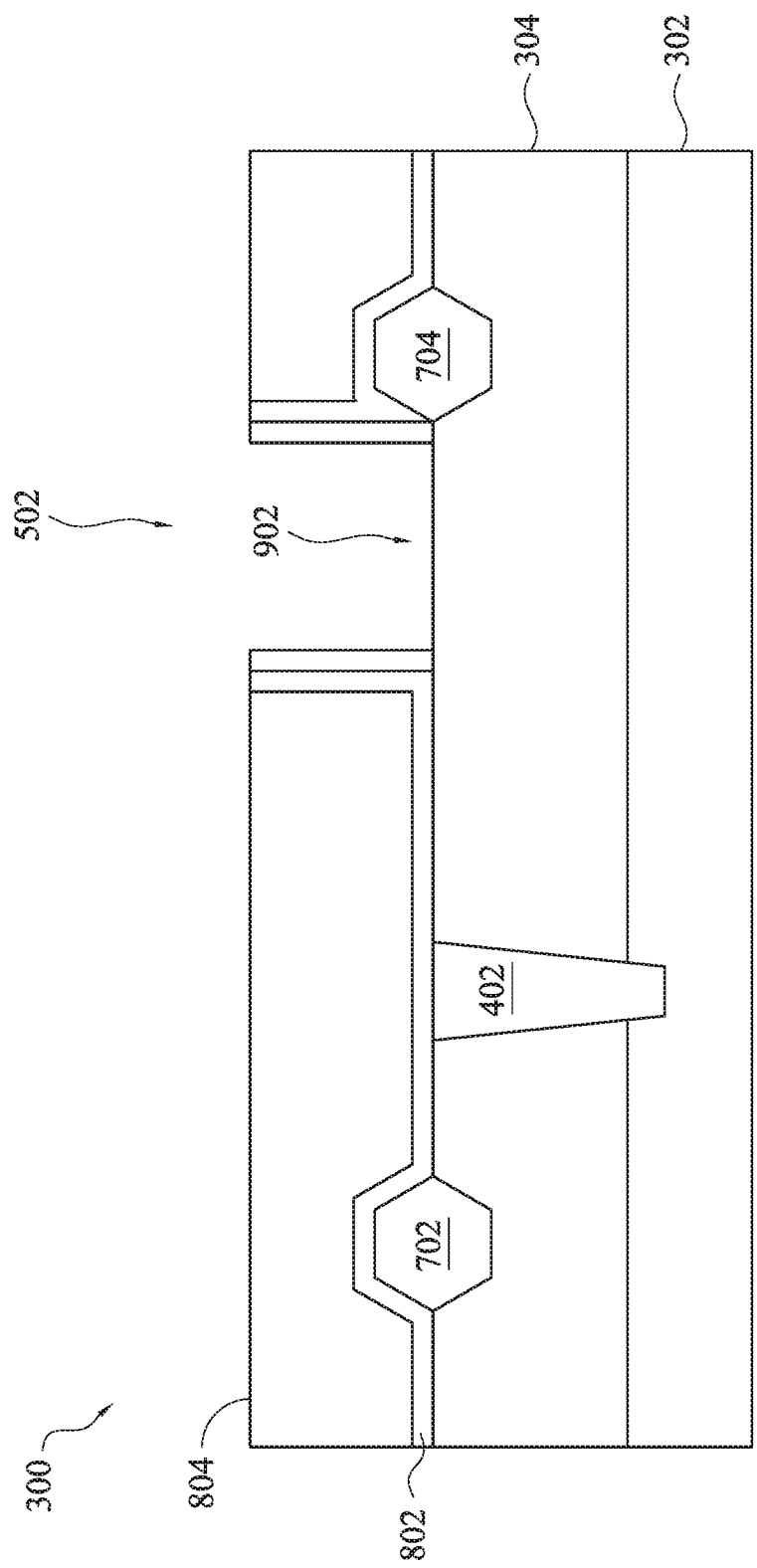
FIG. 9 illustrates a cross-sectional view of the high voltage device after removal of one or more dummy gate stack features, according to some embodiments.
Figure 10:
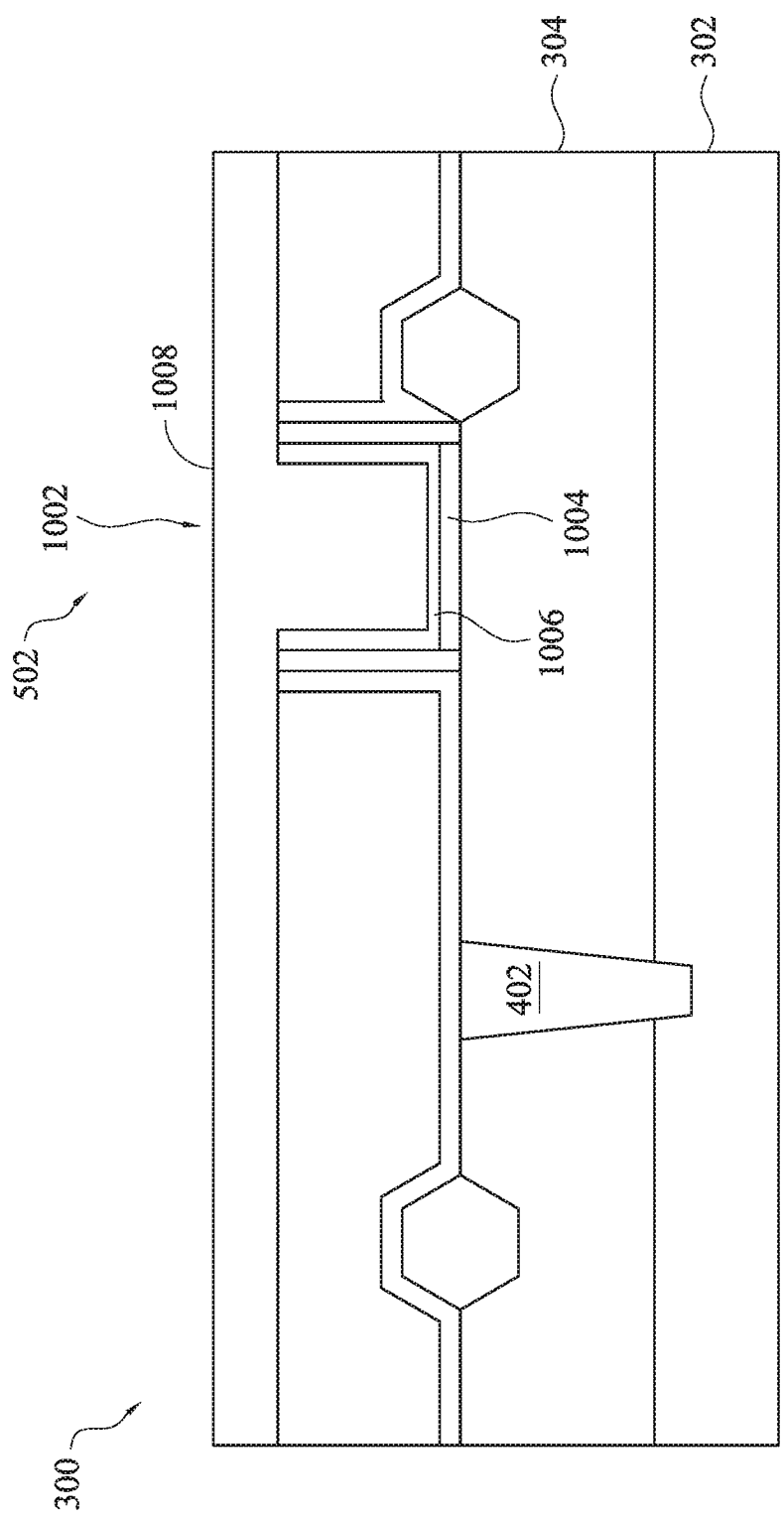
FIG. 10 illustrates a cross-sectional view of the high voltage device after formation of a high-K/metal gate stack, according to some embodiments.
Figure 11:
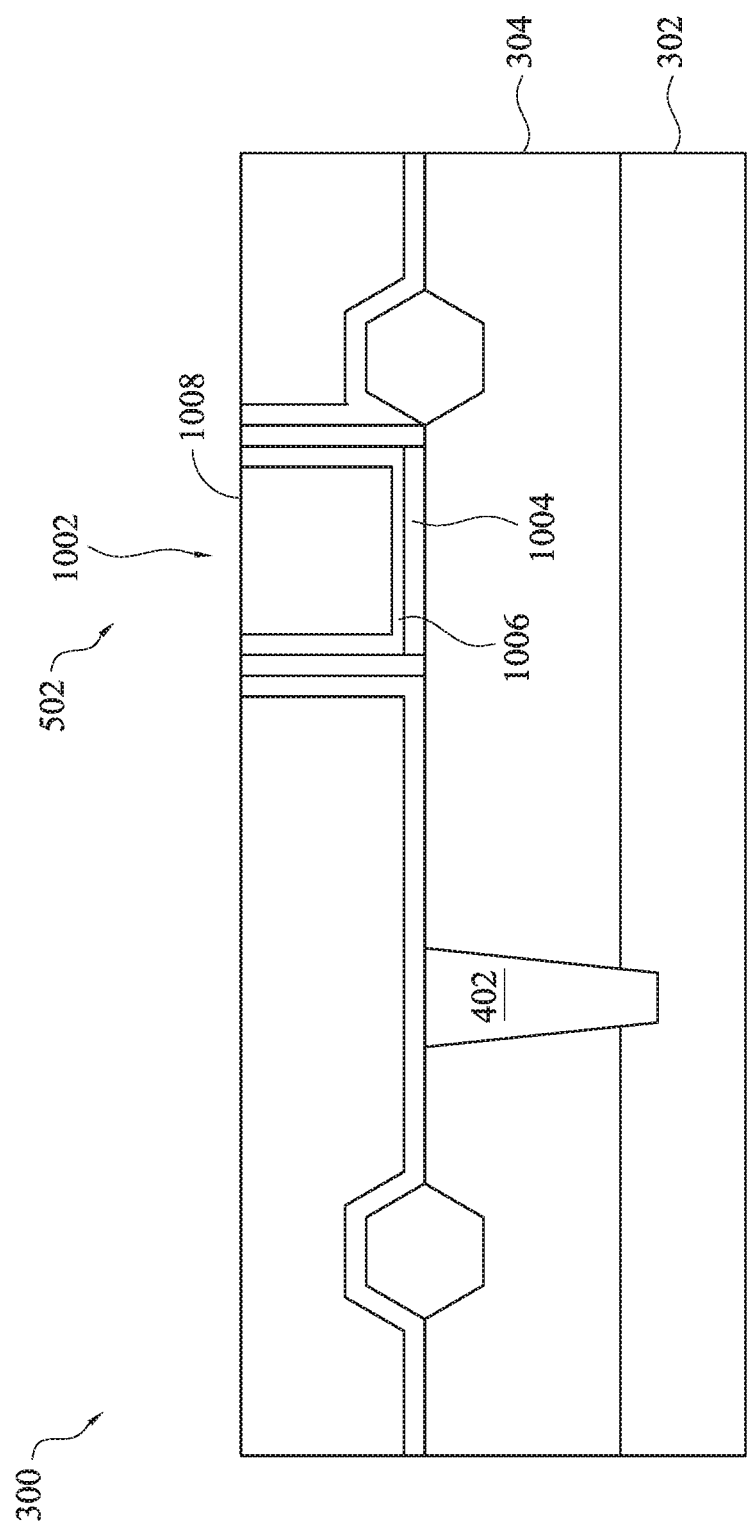
FIG. 11 illustrates a cross-sectional view of the high voltage device after a CMP process of the device of FIG. 10, according to some embodiments.
Figure 12:
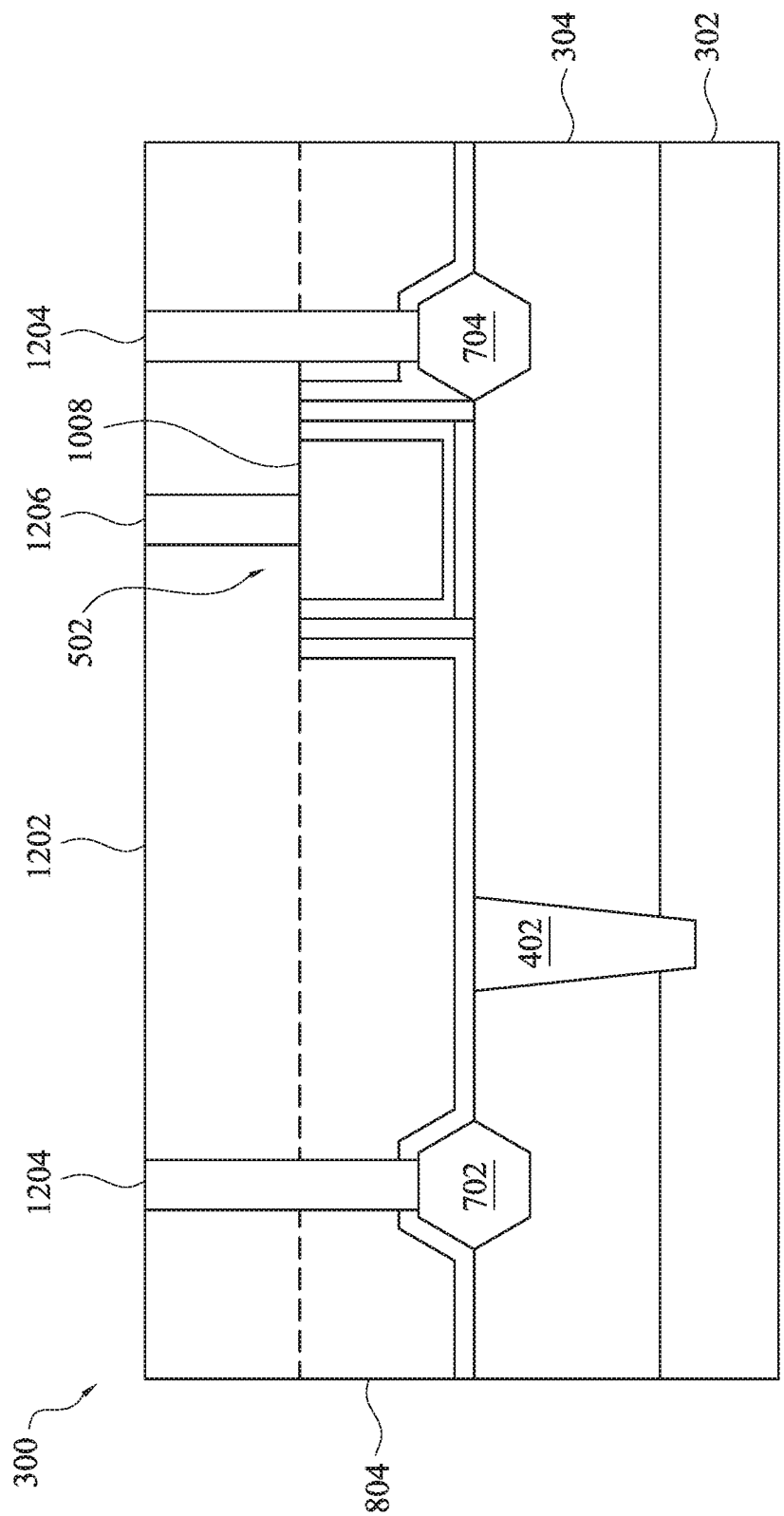
FIG. 12 illustrates a cross-sectional view of the high voltage device after formation a contact metal layer, according to some embodiments.

FIG. 7 further illustrates a large drain extension region 711, similar to the drain extension region 111 of the HV device 100 of FIG. 1. In some embodiments, the drain extension region 711 includes a low doping concentration drift region between a device channel (e.g., under the active gate 502) and the drain feature 702. The low doping concentration drift region (e.g., NHV/PHV regions, RESURF layer, and/or other doped extension regions) is configured to provide a high device breakdown voltage and protection from hot-carrier injection (HCI). As least one challenge for implementing high voltage devices in a fin-type structure, as described above, is the larger drive current available in fin-type devices, enhanced gate-channel coupling, and the electric field profiles present in thin, multi-gate devices (e.g., FinFET devices). Such effects may, in some examples, lead to premature device breakdown or other reliability degradation effects (e.g., HCI). To reduce the likelihood of such effects, the fin-embedded isolation region 402 increases a drain extension resistance, described in more detail below in reference to FIGS. 13 and 14, and also ensures that any high-voltage region remains far from the active gate 502.

In some examples, after forming the source/drain features (block 208), the method 200 proceeds to block 210 where etch stop and dielectric layers are formed on the substrate 302. Referring to the example of FIG. 8, a contact etch stop layer (CESL) 802 and an inter-layer dielectric (ILD) layer 804 are formed over the substrate 302. In some examples, the CESL 802 includes a silicon nitride layer, silicon carbon nitride layer, a silicon oxynitride layer, and/or other materials known in the art. The CESL 802 may be formed by plasma-enhanced chemical vapor deposition (PECVD) process and/or other suitable deposition or oxidation processes. In some embodiments, the ILD layer 804 includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 804 may be deposited by a subatmospheric CVD (SACVD) process, a flowable CVD process, or other suitable deposition technique. In some embodiments, after formation of the ILD layer 804, the semiconductor device 300 may be subject to a high thermal budget process to anneal the ILD layer 804.

In some embodiments, formation of the CESL 802 and ILD layer 804 includes a planarization process (e.g., a CMP process) to expose a top surface of the active gate 502, and which may include exposing a top surface of a dummy gate stack (e.g., in a gate-last process). By way of example, the CMP process can be used to remove portions of the CESL 802 and ILD layer 804 overlying the active gate 502, while also planarizing a top surface of the semiconductor device 300. In embodiments which include a hard mask, the CMP process may also remove the hard mask overlaying the active gate 502.

In an embodiment, the method 200 then proceeds to block 212 where features of the active gate 502 (e.g., dummy gate stack features) are removed from the substrate. The removal of the dummy gate stack features (e.g., the dielectric layer and/or the electrode layer) from the active gate 502 results in a trench, and a final gate stack (e.g., including a high-K dielectric layer and metal gate electrode) may be subsequently formed in the trench. The removal of the dummy gate stack features may include a selective etch process including a selective wet etch or a selective dry etch. Referring to the examples of FIGS. 8 and 9, the active gate 502 includes dummy gate stack features which may include the dielectric layer 510 and the electrode layer 512, which are removed from the substrate 302, resulting in a trench 902. The trench 902 may define a region in which the final gate structure can be formed, as described in further detail below.

The method 200 then proceeds to block 214 where a high-K/metal gate stack is formed. For example, the high-K/metal gate stack may be formed in the trench 902 (FIG. 9) defined by removal of the dummy gate stack features of the active gate 502. Referring to the example of FIG. 10, a high-K metal gate stack 1002 is formed on the device 300. The high-K/metal gate stack 1002 includes an interfacial layer 1004 formed over a channel region of the device 300, where the channel region is disposed within the fin element 304, underlying the active gate 502, along a plane substantially parallel to a plane defined by section AA' of FIGS. 3A and 4A. The high-K/metal gate stack 1002 further includes a high-K gate dielectric layer 1006 formed over the interfacial layer 1004, and a metal layer 1008 formed over the high-K gate dielectric layer 1006. High-K gate dielectrics, as used and described herein, include dielectric material having a high dielectric constant, for example, greater than that of thermal silicon oxide (~3.9). The metal layer 1008 used within high-K/metal gate stack 1002 may include a metal, metal alloy, or metal silicide. Additionally, the formation of the high-K/metal gate stack 1002 includes depositions to form various gate materials and one or more CMP processes to remove excessive gate materials and thereby planarize a top surface of the semiconductor device 300. For example, with reference to the example of FIG. 11, a CMP process is performed to remove excess material of the metal layer 1008, to planarize the top surface of the device 300, and to complete the formation of the gate stack 1002.

The interfacial layer 1004 may include a dielectric material such as silicon oxide ($SiO_2$), HfSiO, or silicon oxynitride (SiON). The interfacial layer 1004 may be formed by chemical oxidation, thermal oxidation, atomic layer deposition (ALD), chemical vapor deposition (CVD), and/or other suitable method. The dielectric layer 1006 of the high-K/metal gate stack 1002 may include a high-K dielectric layer such as hafnium oxide ($HfO_2$). Alternatively, the dielectric layer 1006 of the high-K/metal gate stack 1002 may include other high-K dielectrics, such as $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), combinations thereof, or other suitable material. The high-K gate dielectric layer may be formed by ALD, physical vapor deposition (PVD), CVD, oxidation, and/or other suitable methods.

The metal layer 1008 of the high-K/metal gate stack 1002 may include a single layer or alternatively a multi-layer structure, such as various combinations of a metal layer with a selected work function to enhance the device performance (work function metal layer), liner layer, wetting layer, adhesion layer, metal alloy or metal silicide. By way of example, the metal layer 1008 of the high-K/metal gate stack 1002 may include Ti, Ag, Al, TiAlN, TaC, TaCN, TaSiN, Mn, Zr, TiN, TaN, Ru, Mo, Al, WN, Cu, W, Re, Ir, Co, Ni, other suitable metal materials or a combination thereof. In some embodiments, the metal layer 1008 may include a first metal material for N-type devices 300 and a second metal material for P-type devices 300. Thus the device 300 may include a dual work-function metal gate configuration. For example, the first metal material (e.g., for N-type devices) may include metals having a work function substantially aligned with a work function of the substrate conduction band, or at least substantially aligned with a work function of the conduction band of the channel region of the fin 304. Similarly, for example, the second metal material (e.g., for P-type devices) may include metals having a work function substantially aligned with a work function of the substrate valence band, or at least substantially aligned with a work function of the valence band of the channel region of the fin 304. Thus, the metal layer 1008 may provide a gate electrode for the device 300, including both N-type and P-type devices 300. In some embodiments, the metal layer 1008 may alternately include a polysilicon layer. The metal layer 1008 of the high-K/metal gate stack 1002 may be formed by ALD, PVD, CVD, e-beam evaporation, or other suitable process. Further, the metal layer 1008 of the high-K/metal gate stack 1002 may be formed separately for N-FET and P-FET transistors which may use different metal layers.

The method 200 then proceeds to block 216 where an interlayer dielectric (ILD) layer is formed over the substrate 302. Referring to the example of FIG. 12, an ILD layer 1202 is formed over the substrate 302. In some embodiments, the ILD layer 1202 includes silicon oxide, silicon oxynitride, a low-K dielectric material or other suitable dielectric material. In some embodiments, the ILD layer 1202 may include a single layer or multiple layers. By way of example, the ILD layer 1202 may be formed by any of a plurality of suitable techniques including CVD, ALD, and spin-on techniques (e.g., for depositing spin-on-glass). In some embodiments, a CMP process may be performed after formation of the ILD layer to remove excess material from the ILD layer 1202 and planarize the top surface of the semiconductor device 300.

Referring still to block 216 of the method 200, contact openings are formed for the device 300. Referring again to the example of FIG. 12, source, drain, and gate contact openings are formed in the dielectric layers 804, 1202 to provide access to the drain and source features 702, 704, as well as to the metal layer 1008 of the active gate 502. By way of example, such contact openings may be formed by a suitable combination of lithographic patterning and etching (e.g., wet or dry etching) processes. In some embodiments, the source/drain contact openings may be patterned and etched separately from the gate contact opening. In some embodiments, the source/drain contact openings may be patterned and etched simultaneously with the gate contact opening. The method 200 then proceeds to block 218 where source, drain, and gate contact metal is formed within the source, drain, and gate contact openings described above with reference to block 216. With reference once again to the example of FIG. 12, a source/drain contact metal 1204 and a gate contact metal 1206 are formed, for example by ALD, PVD, CVD, e-beam evaporation, or other suitable process. In some embodiments, the source/drain contact metal 1204 may be formed separately from the gate contact metal 1206. In some embodiments, the source/drain contact metal 1204 may be formed simultaneously with the gate contact metal 1206. Thus, the source/drain contact metal 1204 may be directly coupled to the drain and source features 702, 704. Likewise, the gate contact metal 1206 may be directly coupled to the metal layer 1008 of the active gate 502. In some embodiments, an intermediate layer (e.g., a Schottky barrier height layer) may be formed between the drain and source features 702, 704 and the source/drain contact metal 1204, such that the source/drain contact metal 1204 is coupled to the drain and source features 702, 704 by way of the intermediate layer.

The semiconductor device 300 may undergo further processing to form various features and regions known in the art. For example, subsequent processing may form various contacts/vias/lines and multilayers interconnect features (e.g., metal layers and interlayer dielectrics) on the substrate 302, configured to connect the various features to form a functional circuit that may include one or more FinFET devices. In furtherance of the example, a multilayer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multi-layer interconnection structure. Moreover, additional process steps may be implemented before, during, and after the method 200, and some process steps described above may be replaced or eliminated in accordance with various embodiments of the method 200.

Figure 13:
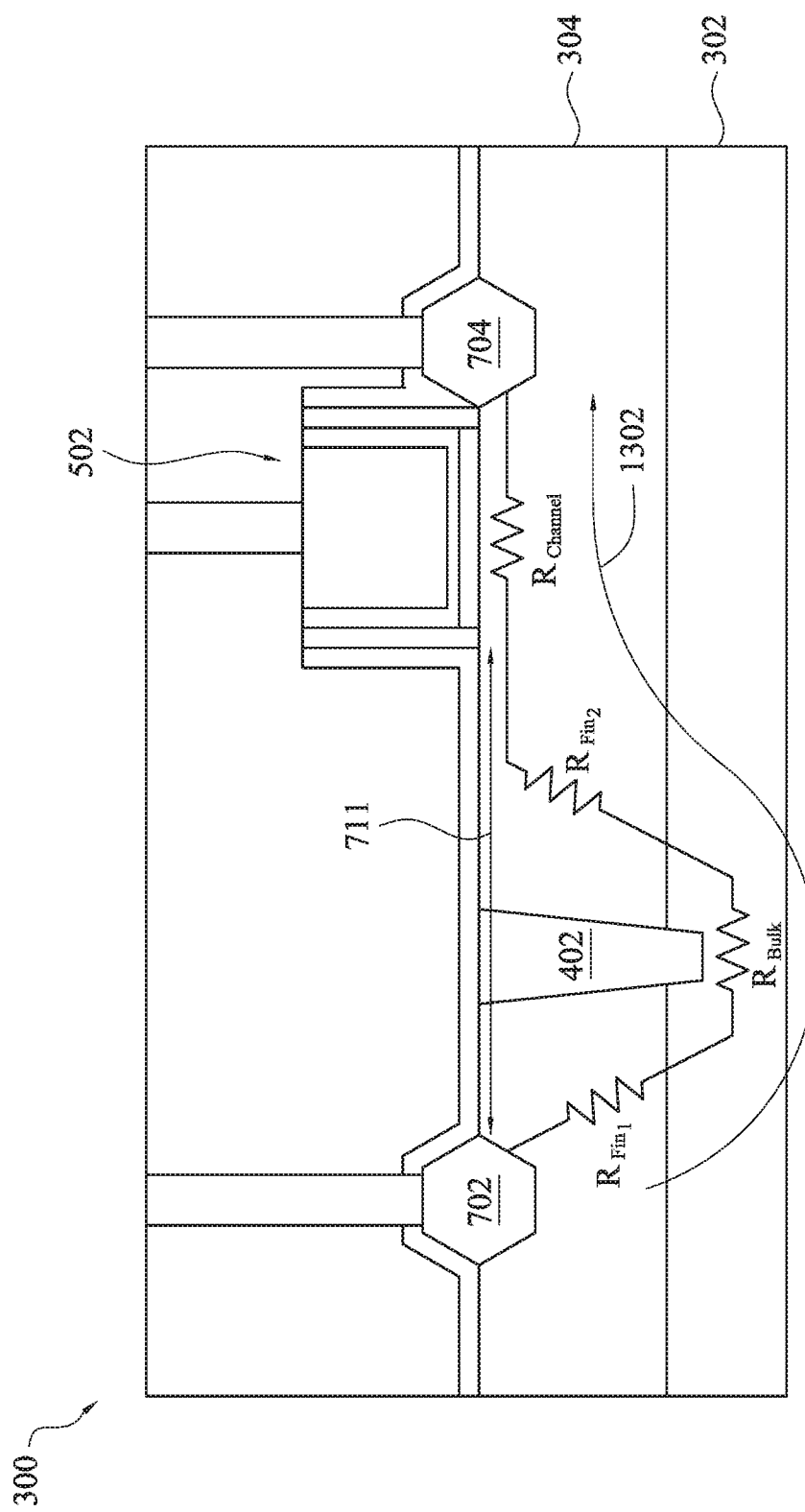
FIG. 13 schematically illustrates a resistance path between a source region and a drain region in a high voltage device including a fin-embedded isolation region, according to one or aspects of the present disclosure.

Referring now to FIG. 13, the semiconductor device 300, fabricated in accordance with one or more steps of the method 200, is illustrated. In an embodiment, the illustrated semiconductor device 300 includes the drain feature 702, the source feature 704, and the active gate 502, which together form a transistor (e.g., a high voltage and/or power transistor such as an LDMOS transistor). In particular, the example of FIG. 13 illustrates a resistance path 1302 between the drain feature 702 and the source feature 704. Rather than a direct, low resistance path between the drain and source features 702, 704 (e.g., through the fin element 304), the fin-embedded isolation region 402 serves to increase the resistance of the drain extension region 711. For example, current flowing from the drain feature 702 to the source feature 704 flows under the fin-embedded isolation region 402, into the substrate 302 (i.e., semiconductor bulk region), and then flows back into the fin element 304 and through the channel region of the device 300 (e.g., under the active gate 502), and into the source feature 704. Thus, in some embodiments, a total resistance between the drain and source features 702, 704 may be expressed as a sum of a first fin resistance ($R_{Fin1}$), a bulk resistance ($R_{Bulk}$), a second fin resistance ($R_{Fin2}$), and a channel resistance ($R_{Channel}$). In various embodiments, one or more doped regions, described above (e.g., NHV/PHV regions, RESURF layer, and/or other doped extension regions), may be configured to adjust one or more of the fin resistances ($R_{Fin1}$ and/or $R_{Fin2}$) and the channel resistance ($R_{Channel}$). In some embodiments, a position of the fin-embedded isolation region 402 may be varied (e.g., closer to the drain feature 702 or closer to the active gate 502) in order to adjust one or more of the resistances shown in FIG. 13 (e.g., $R_{Fin1}$ and/or $R_{Fin2}$). In some embodiments, $R_{Bulk}$ may be greater than $R_{Fin1}$, $R_{Fin2}$, and $R_{Channel}$. In some examples, $R_{Fin1}$ may be substantially equal to $R_{Fin2}$. While a few examples of methods for adjusting the total resistance between the drain and source features 702, 704, as well some examples of relative values among $R_{Bulk}$, $R_{Fin1}$, $R_{Fin2}$, and $R_{Channel}$ have been given, those of ordinary skill in the art will appreciate that many other relative resistance values and other methods for adjusting each of the component resistances (i.e., $R_{Bulk}$, $R_{Fin1}$, $R_{Fin2}$, and $R_{Channel}$) may be employed without departing from the scope of the present disclosure. As discussed above, the increased resistance of the drain extension region 711 provided by the fin-embedded isolation region 402 serves to reduce the likelihood of premature device breakdown or other reliability degradation effects (e.g., HCI) in the semiconductor device 300, which will exhibit enhanced drive current (among other effects typical of FinFET devices).

Figure 14:
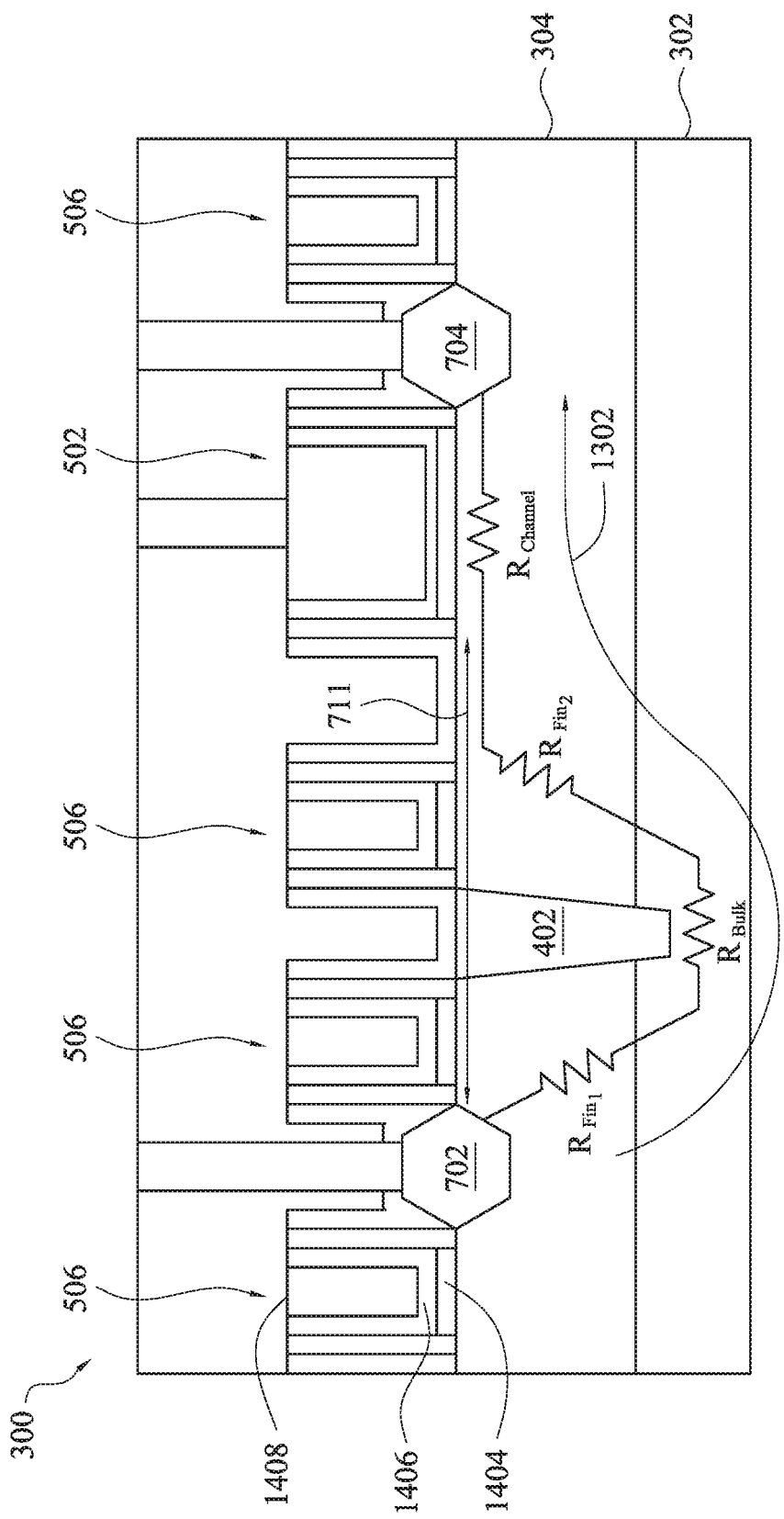
FIG. 14 schematically illustrates a resistance path between a source region and a drain region in a high voltage device including a fin-embedded isolation region and a plurality of dummy gates, according to one or aspects of the present disclosure.

Referring now to FIG. 14, the semiconductor device 300, fabricated in accordance with one or more steps of the method 200, and including a plurality of dummy gates, is illustrated. Specifically, the example of FIG. 14 illustrates the device 300 including the plurality of dummy gates 506, as discussed above with reference to FIG. 5. While not illustrated for clarity of discussion in FIGS. 6-12, embodiments that include the dummy gates 506 may also include processing of the dummy gates 506 in a manner substantially similar to the processes used to form the active gate 502. For example, in some embodiments, processing of the dummy gates 506 may also include removal of the dummy gate stack features (e.g., the dielectric layer 514 and the electrode layer 516, shown in FIG. 5), followed by subsequent formation of a high-K/metal gate stack, in a manner similar to that which is described above with reference to FIGS. 9-11. Thus, the high-K/metal gate stack for the dummy gates 506 may likewise include an interfacial layer 1404, a high-K gate dielectric layer 1406, and a metal layer 1408. Moreover, in embodiments of the device 300 which include the dummy gates 506, the interfacial layers 1004, 1404 of each of the active and dummy gates 502, 506 may be formed simultaneously, the high-K gate dielectric layers 1006, 1406 of each of the active and dummy gates 502, 506 may be formed simultaneously, and the metal layers 1008, 1408 of each of the active and dummy gates 502, 506 may be formed simultaneously. In addition, materials used for each of the interfacial layer 1404, the high-K gate dielectric layer 1406, and the metal layer 1408 of the dummy gates 506 may be the same as those listed above for the interfacial layer 1004, the high-K gate dielectric layer 1006, and the metal layer 1008 of the active gate 502.

In various embodiments, the dummy gates 506 are formed, in addition to the active gate, in order to provide a uniform epitaxial growth profile for both the drain feature 702 and the source feature 704. As described herein, an epitaxial growth profile may include a doping profile and/or a physical profile (i.e., a shape) of the drain and source features 702, 704. In some examples, the dummy gates 506 provide a more uniform environment in which processing of the device 300 is performed. Such a uniform processing environment may be especially important in multi-gate device architectures, such as in FinFET device architectures, where the complex device architecture (e.g., as compared to planar CMOS devices) and the highly-scaled geometries can make multi-gate devices more susceptible to environmental non-uniformities and process loading effects. Thus, in various embodiments, the dummy gates 506 may result in more reliable and repeatable processes.

For example, the dummy gates 506 may provide for more uniform etch rates (e.g., when forming the drain and source recesses 606, 608), may reduce and/or prevent CMP-induced dishing effects, and overall may provide a more uniform growth environment for superior epitaxial growth of the drain and source features 702, 704. The example of FIG. 14 also illustrates the resistance path 1302 between the drain and source features 702, 704 similar to the example of FIG. 13, where the fin-embedded isolation region 402 serves to increase the resistance of the drain extension region 711, thereby reducing the likelihood of premature device breakdown or other reliability degradation effects in the semiconductor device 300. The superior epitaxial growth profiles of the drain and source features 702, 704, enabled for example by the dummy gates 506, also improve a drain resistance ($R_{Drain}$) and a source resistance ($R_{Source}$), by making such resistances more uniform and more repeatable. While a few benefits of using the dummy gates 506 have been described herein, those of ordinary skill in the art will appreciate many other benefits and advantages of using the dummy gates 506 without departing from the scope of the present disclosure.

The various embodiments described herein offer several advantages over the existing art. It will be understood that not all advantages have been necessarily discussed herein, no particular advantage is required for all embodiments, and other embodiments may offer different advantages. In various examples, embodiments discussed herein include structures and methods for implementation of high-voltage devices (e.g., LDMOS devices) within multi-gate device structures (e.g., FinFET device structures). In some embodiments, a fin-embedded isolation region is formed between a FinFET channel (e.g., under a FinFET gate stack) and drain, in order to increase a drain extension resistance and also ensure that any high-voltage region remains far from the active device gate. In some embodiments, the fin-embedded isolation region includes a shallow trench isolation (STI) feature. In some examples, use of the fin-embedded isolation region serves to reduce the likelihood of premature device breakdown or other reliability degradation effects (e.g., HCI) in high voltage devices such as the semiconductor devices described herein. In some embodiments, a plurality of dummy gates is formed, in addition to the active gate, to provide a uniform growth environment, and thus a uniform epitaxial growth profile, for both the source and drain regions. In some examples, use of dummy gates provide for a uniform epitaxial growth profiles regardless of any specific device layout.

Thus, one of the embodiments of the present disclosure described a semiconductor device including a substrate having a fin extending therefrom and a fin-embedded isolation region. In some examples, the fin-embedded isolation region includes an STI region. In some embodiments, the fin-embedded isolation separates a first portion of the fin from a second portion of the fin. Also, in some examples, the first portion of the fin includes a channel region. In various embodiments, a source region is formed in the first portion of the fin, a drain region is formed in the second portion of the fin, and an active gate is formed over the channel region. In some examples, the active gate is disposed adjacent to a first side of the source region.

In another of the embodiments, discussed is a high voltage semiconductor device including a substrate having a plurality of fins extending therefrom. In some examples, a fin-embedded isolation region spans the plurality of fins and separates a first portion of each fin of the plurality of fins from a second portion of each fin of the plurality of fins. In some embodiments, a first portion of at least one fin of the plurality of fins includes a channel region. Additionally, a source region is formed in the first portion of the at least one fin, and a drain region is formed in the second portion of the at least one fin. An active gate, disposed adjacent to the source region, is also formed over the channel region of the at least one fin.

In yet another of the embodiments, discussed is a method of semiconductor device fabrication where a substrate including a fin extending therefrom is provided. In various embodiments, the method includes forming a fin-embedded isolation region that separates a first portion of the fin from a second portion of the fin. In some examples, the fin-embedded isolation region extends into the substrate. A source region may then be formed in the first portion of the fin and a drain region may be formed in the second portion of the fin. In some embodiments, the method further includes forming an active gate over a channel region of the first portion of the fin. In some cases, the active gate is disposed adjacent to a first side of the source region. In addition, the method may also include forming a plurality of dummy gates over the fin.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A device, comprising:
a substrate including at least one fin extending therefrom;
a fin-embedded isolation region that extends into the substrate and separates a first portion of the at least one fin from a second portion of the at least one fin, wherein the first portion of the at least one fin includes a channel region; and a source region formed in the first portion of the at least one fin and a drain region formed in the second portion of the at least one fin.

2. The device of claim 1, further comprising:
an active gate formed over the channel region, wherein the active gate is disposed adjacent to a first side of the source region.

3. The device of claim 1, wherein the device includes a high voltage semiconductor device.

4. The device of claim 1, further comprising:
the substrate including a plurality of fins extending therefrom, wherein the plurality of fins includes the at least one fin; and
wherein the fin-embedded isolation region spans the plurality of fins and separates a first portion of each fin of the plurality of fins from a second portion of each fin of the plurality of fins.

5. The device of claim 1, wherein the fin-embedded isolation region includes a shallow trench isolation (STI) region.

6. The device of claim 1, further comprising a first extension region adjacent to and between the channel region and the fin-embedded isolation region, and a second extension region adjacent to and between the fin-embedded isolation region and the drain region.

7. The device of claim 1, further comprising a plurality of dummy gates disposed over the fin.

8. A method, comprising:
providing a substrate including a plurality of fins extending therefrom;
forming a fin-embedded isolation region that spans the plurality of fins and separates a first portion of each fin of the plurality of fins from a second portion of each fin of the plurality of fins, wherein a first portion of at least one fin of the plurality of fins includes a channel region;
forming a source region in the first portion of the at least one fin; and
forming a drain region, at a selected distance from the fin-embedded isolation region, in the second portion of the at least one fin, wherein the selected distance is chosen to provide a selected fin resistance.

9. The method of claim 8, further comprising:
forming an active gate over the channel region of the at least one fin, wherein the active gate is disposed adjacent to the source region.

10. The method of claim 8, wherein the forming the fin-embedded isolation region includes forming a shallow trench isolation (STI) region that extends into the substrate.

11. The method of claim 10, wherein responsive to forming the STI region that extends into the substrate, forming a conductive path between the source region and the drain region that traverses at least a portion of the substrate under the STI region.

12. The method of claim 8, further comprising:
forming a first extension region within the at least one fin, wherein the first fin extension region is adjacent to and between the channel region and the fin-embedded isolation region.

13. The method of claim 12, further comprising:
forming a second extension region within the at least one fin, wherein the second fin extension region is adjacent to and between the fin-embedded isolation region and the drain region.

14. The method of claim 8, further comprising:
forming a plurality of dummy gates disposed over the at least one fin.

15. A method of semiconductor device fabrication, comprising:
providing a substrate including a fin extending therefrom;
forming a fin-embedded isolation region that separates a first portion of the fin from a second portion of the fin, wherein the first portion of the fin includes a channel region;
providing, by a plurality of dummy gates formed over the fin, a uniform growth environment for subsequent formation of a source region and a drain region; and
forming the source region in the first portion of the fin and the drain region in the second portion of the fin.

16. The method of claim 15, further comprising:
forming an active gate over the channel region, wherein the active gate is disposed adjacent to a first side of the source region.

17. The method of claim 15, wherein the forming the fin-embedded isolation region includes forming a shallow trench isolation (STI) region that extends into the substrate.

18. The method of claim 15, wherein the uniform growth environment provides a uniform epitaxial growth profile for both of the source region and the drain region.

19. The method of claim 15, wherein a pair of dummy gates of the plurality of dummy gates are disposed adjacent to and on either side of the drain region.

20. The method of claim 19, wherein a dummy gate of the plurality of dummy gates is disposed adjacent to a second side of the source region.

* * * * *